United States Patent [19]
Johnson et al.

[11] 3,944,892
[45] Mar. 16, 1976

[54] SMALL COMPACT CATHODE RAY OSCILLOSCOPE ASSEMBLY

[75] Inventors: Richard A. Johnson, Round Lake; Douglas E. Scott, Round Lake Beach, both of Ill.

[73] Assignee: Norcon Electronic Laboratories, Inc., Round Lake, Ill.

[22] Filed: Oct. 21, 1974

[21] Appl. No.: 516,694

[52] U.S. Cl. ........... 317/120; 178/7.9; 317/101 DH; 339/17 LC
[51] Int. Cl.² ..................... H05K 7/06; H04N 5/64
[58] Field of Search ...... 317/99, 100, 101 R, 101 D, 317/101 DH, 101 CB, 117, 120; 339/17 L, 17 LC, 17 LM, 17 M, 176 MP, 193 P; 178/7.8, 7.9; 325/310, 356

[56] References Cited
UNITED STATES PATENTS

| | | | |
|---|---|---|---|
| 2,904,772 | 9/1959 | Artz | 339/193 P |
| 3,104,282 | 9/1963 | Horn et al. | 317/101 DH |
| 3,139,485 | 6/1964 | Gray et al. | 178/7.9 |
| 3,344,243 | 9/1967 | DeVries | 317/101 DH |
| 3,508,117 | 4/1970 | Cuzner | 317/101 DH |
| 3,755,630 | 8/1973 | Boyer | 317/120 |

*Primary Examiner*—Gerald P. Tolin
*Attorney, Agent, or Firm*—Bernard L. Kleinke; Thomas W. Speckman; Leonard J. Kalinowski

[57] ABSTRACT

A cathode ray oscilloscope assembly adapted to be connected to a circuit for conveying electrical input signals and electrical power thereto, includes a cathode ray oscilloscope tube adapted to be connected to the input circuit to establish an electron beam for illuminating the face of the tube screen, a deflection device mounted on the tube neck portion and connected electrically to the input circuit for moving selectively the beam, a rear end circuit panel fixedly connected to the tube and extending transversely to the neck portion of the tube, a plurality of side circuit panels extending forwardly from said rear panel toward the tube screen parallel to the axis of the neck portion of the tube to form an open boxlike configuration with the rear end panel for receiving the neck portion of the tube, and connectors interconnecting mechanically the adjoining marginal edges of the side panels to the rear panel and interconnecting electrically circuit elements mounted on the rear end and side panels for controlling the deflection device to selectively illuminate the tube screen in response to the input signals. The height and width of the face of the rear panel are less than the respective height and width of the screen, and the length of the entire cathode ray oscilloscope assembly is substantially the same as the length of the cathode ray tube itself. The width of the side panels is less than the corresponding dimensions of the tube screen. Thus, the overall dimensions of the cathode ray oscilloscope assembly are substantially the same as the overall dimensions of the tube forming a part thereof, whereby the assembly is extremely compact in size for a given cathode ray tube.

11 Claims, 12 Drawing Figures

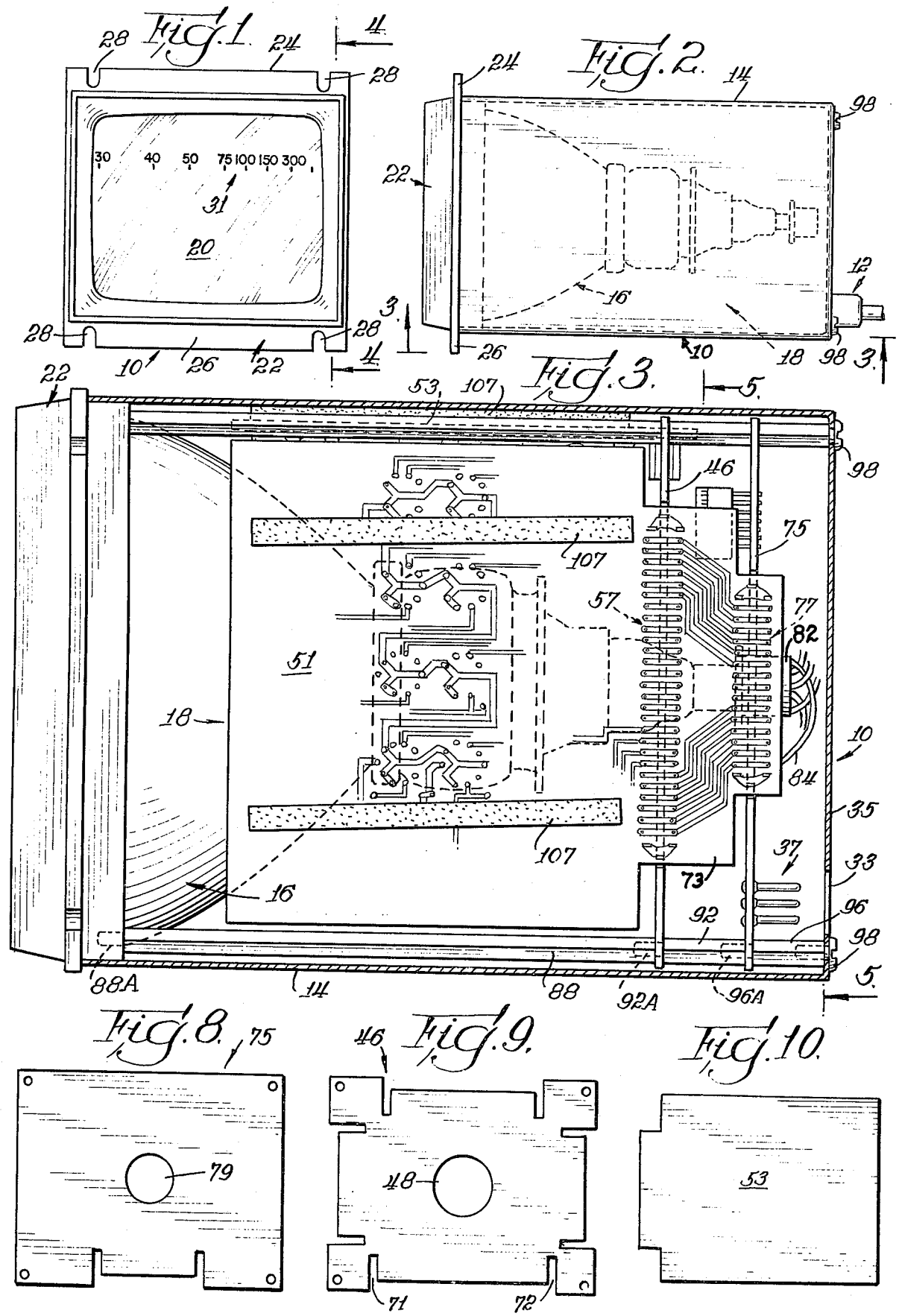

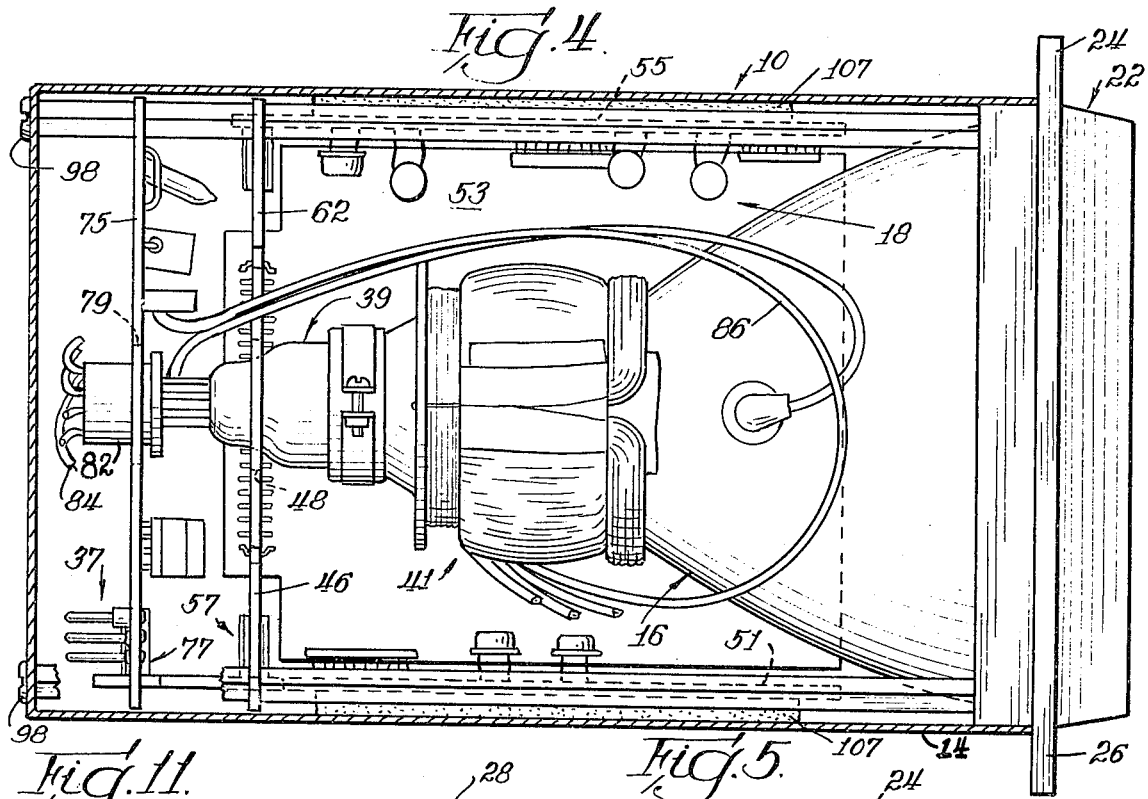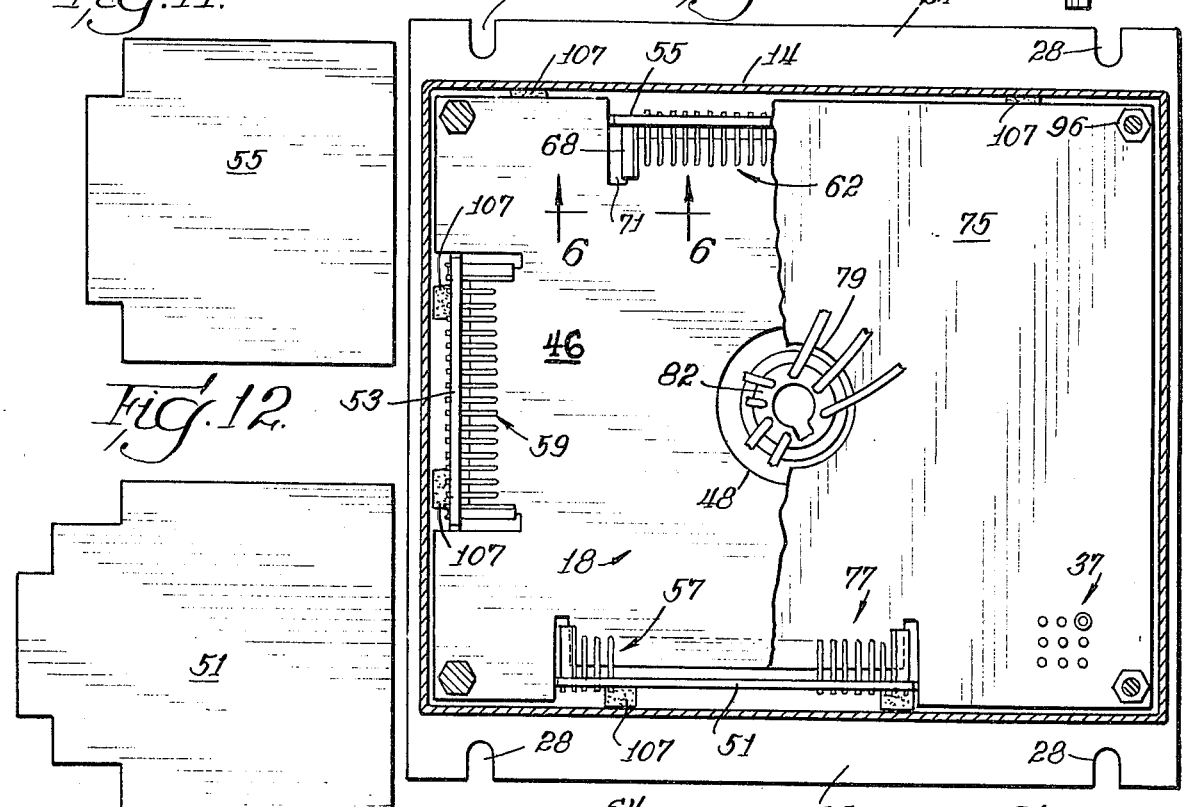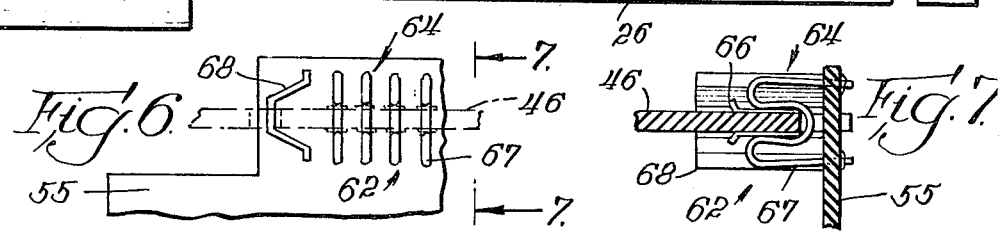

SMALL COMPACT CATHODE RAY OSCILLOSCOPE ASSEMBLY

The present invention relates to a cathode ray oscilloscope assembly, and it more particularly relates to a cathode ray oscilloscope assembly, which is small in size and light in weight to facilitate its use in medical applications, such as monitoring human heartbeats.

Cathode ray oscilloscopes have been successfully employed as instrumentation for medical purposes. In this regard, cathode ray oscilloscopes have been used for monitoring heartbeats of human patients, as well as for other purposes. While such cathode ray oscilloscopes have been satisfactorily utilized for some applications, it would be highly desirable to have a cathode ray oscilloscope assembly which is extremely compact in size as compared to the heretofore known cathode ray oscilloscope assemblies used for medical instrumentation purposes. Since electronic and other instrumentation are being widely used to facilitate the treatment and care of patients, limitations on the space occupied by such instrumentation are becoming more and more severe. Therefore, for a given application, an instrument should be as small as possible in size and yet still be large enough to observe and use conveniently. In the case of a cathode ray oscilloscope, the screen ought to be large enough to conveniently display a trace of a human vital sign, such as a heartbeat, but the oscilloscope should be small enough to occupy as little space as possible. The optimum cathode ray oscilloscope assembly used for medical instrumentation purposes or other such applications should have a screen which is as small as possible, and all of the control circuits for the tube should be able to be mounted within a housing which has overall dimensions substantially the same as the corresponding dimensions of the tube itself. In other words, height and width of the transverse cross-sectional area of the cathode ray oscilloscope assembly should be substantially the same as the respective height and width of the face of the tube, and the overall length of the assembly should be approximately the same as the overall length of the tube. Such an assembly should be constructed in such a small compact manner as heretofore described without resorting to initially expensive miniaturized control circuits, such as large scale integrated circuits.

Prior art tube assemblies and similar devices have been disclosed in the following U.S. Pat. Nos. 2,815,252; 2,951,184, 2,958,013; 3,370,202; 3,290,559; 3,467,892; 3,508,117; 3,596,139 and 3,702,423. However, none of the circuit assemblies disclosed in the foregoing patents are sufficiently compact in size for medical instrumentation purposes.

Therefore, the principal object of the present invention is to provide a new an improved cathode ray oscilloscope assembly, which is compact in size and which is light in weight.

Another object of the present invention is to provide such a cathode ray oscilloscope assembly which has an overall length substantially the same as the overall length of the cathode ray tube itself, and which has a height and width of its transverse cross-sectional area substantially the same as the corresponding height and width of the screen of the tube.

Briefly, the above and further objects of the present invention are realized by providing a cathode ray oscilloscope assembly including a cathode ray oscilloscope tube having mounted on its neck portion a deflection device for moving selectively the electron beam of the tube, a rear end circuit panel fixedly connected to the tube and extending transversely to the neck portion thereof, a plurality of side circuit panels extending forwardly from the rear panel toward the screen of the tube parallel to the axis of the neck portion of the tube to form an open boxlike configuration with the rear end panel for receiving the neck portion, and connectors interconnecting mechanically the adjoining marginal edges of the side panels to the rear panel and interconnecting electrically circuit elements supported by the rear end and side panels for energizing selectively the deflection device to selectively illuminate the screen of the tube in response to input signals. The height and width of the face of the rear panel is less than the respective height and width of the tube screen, whereby the overall dimensions of the assembly are substantially the same as the overall dimensions of the tube itself.

The above, and still further highly important objects and advantages of the invention will become apparent from the following detailed specification, appended claims, and attached drawings, wherein:

FIG. 1 is a front elevational view of a cathode ray oscilloscope assembly employing the principals of the present invention;

FIG. 2 is a side elevational view of the assembly of FIG. 1;

FIG. 3 is a bottom enlarged crosssectional view of the assembly of FIG. 2 taken substantially along the line 3—3 thereof;

FIG. 4 is a side enlarged crosssectional view of the assembly of FIG. 2 taken substantially along the line 4—4 thereof;

FIG. 5 is an enlarged cross-sectional view of the back portion of the assembly of FIG. 3 taken substantially along the line 5—5 thereof;

FIG. 6 is a detail enlarged view of a connector of FIG. 5 taken substantially along the line 6—6 thereof;

FIG. 7 is a cross-sectional view of the connector of FIG. 6 taken substantially along the line 7—7 thereof; and FIGS. 8 through 12 are face views of the printed wiring boards used in the assembly of FIG. 1, illustrating them without the circuit components and conductors mounted thereon, in reduced scale.

Referring now to the drawings, and more particularly to FIGS. 1 and 2 thereof, there is shown an oscilloscope assembly 10, which is constructed in accordance with the principals of the present invention, and which is adapted to receive a cord and socket assembly generally indicated at 12 for supplying power and input signals to the assembly 10. The assembly 10 is intended to monitor heartbeats of human patients and is a refresh oscilloscope. While the assembly 10 is shown and described to be a refresh oscillopscope used for monitoring heartbeats, it is to be understood that the principles of the present invention may be employed in other applications, such as other types and kinds of oscilloscopes as well as other electronic equipment requiring compact, light-weight packaging. The assembly 10 generally comprises an elongated housing 14 which encloses a cathode ray tube 16 (FIG. 3) and its control circuit elements generally indicated at 18 (FIG. 2) as hereinafter described in greater detail. A screen 20 of the tube 16 is positioned generally within the front open end of the housing 14 and is surrounded by and at least partially attached to the housing by a bezel 22 which has a pair of upper and lower flanges 24 and 26 each including a pair of open holes 28 to facilitate mounting the assembly 10 in a control panel (not shown) when used for medical instrumentation purposes. Indicia 31 on the face of the screen 20 facilitates the reading of the trace displayed on the face of the screen 20 to monitor heartbeats. It should be understood that the indicia 31 may be disposed on a transparent sheet (not shown) mounted between the face of the screen 20 and the bezel 22, if desired. Also it should be understood that different types and kinds of indicia may be employed depending upon use of the assembly 10. In a preferred form of the present invention, the overall dimensions of the assembly 10 are approximately 5 inches wide by approximately 4 inches high by approximately 6⅞ inches long. Such dimensions are approximately the same as the overall dimensions of the tube 16 and therefore the assembly 10 is very compact and lightweight to use. While the assembly 10 is adapted to be mounted on a control panel, it may also be used, if desired, as a separate self-contained unit by attaching a power supply, such as a battery (not shown), to the assembly 10 so that the assembly 10 can then be used as a portable unit.

Considering now the housing 14 in greater detail with reference to FIGS. 2, 3, 4 and 5 of the drawings, the housing 14 is composed of a rigid material, such as steel, and is rectangular in crosssection. The housing 14 is in the shape of a hollow box having an open front end in which the screen 31 of the tube 16 is positioned. The front end portion of the housing 14 fits over the rear end portion of the bezel 22 and, as shown in the drawings, fits against the upper and lower flanges 24 and 28. As shown in FIG. 3, an access opening 33 in the rear wall 35 of the housing 14 enables the plug portion of the assembly 12 to extend therethrough and engage pin terminals 37 for supplying the necessary power and input signals to the control circuit elements 18.

Considering now the cathode ray tube 16 in greater detail, the tube 16 includes a rearwardly extending longitudinal neck portion 39 extending from the screen 20. The tube 16 is a conventional tube, which establishes an electron beam for illuminating the screen 20, the tube 16 being any suitable cathode ray oscilloscope tube, such as the preferred one which may be purchased from Clinton Electronics of Rockford, Illinois, an alternate tube being made by Hitachi of Japan, Type Number 140ATB4. A deflection device in the form of deflection coils generally indicated at 41 surround a portion of the neck portion 39 for diverting selectively the path of travel of the electron beam of the tube 16. The deflection coils 41 are controlled by the electronic control circuit elements 18 for energizing selectively the deflection coils 41 to selectively illuminate the screen 20 in response to the input signals supplied to the assembly 10 by the socket and cord assembly 12. While the tube 16 is controlled by the coils 41 to provide for magnetic deflection of the beam, it is to be understood that the cathode ray oscilloscope tube may also be of the electrostatic type, if desired.

Considering now the control circuit elements 18 with reference to FIGS. 3, 4 and 5 of the drawings, the control circuit elements 18 are in the form of electronic circuits, including transistors and other circuit components for controlling the operation of the cathode ray tube 16. Only a small portion of the entire number of control circuit elements is illustrated in the drawings for sake of simplicity. According to the present invention, the control circuit elements 18 are mounted within the housing 14 in an extremely compact manner so that the overall dimensions of the assembly 10 are substantially the same as the overall dimensions of the cathode ray tube 16. In order to support and carry the control circuit panel in the form of a printed circuit board 46 extends transversely to the neck portion 39 of the tube 16 to support and carry conductors (not shown) for interconnecting the components of the control circuit elements 18. The height and width of the face of the rear end panel 46 is less than the corresponding height and width of the screen 20. A hole 48 in the printed circuit board 46, as best seen in FIG. 9, enables the neck portion 46, as best seen in FIG. 9, enables the neck portion 39 to extend therethrough in a compact manner. A bottom side panel in the form of a printed circuit board 51 extends forwardly at right angles to the rear end panel 46 and is mounted thereto for supporting a portion of the control circuit elements 18. Similarly, a left side panel in the form of a printed circuit board 53 extends perpendicularly from the rear end panel 46 toward the screen 20 and is mounted to the rear end panel to carry additional portions of the control circuit elements 18. Additionally, a top side panel in the form of a printed circuit board 55 is mounted to the rear end panel 46 and extends perpendicularly therefrom toward the screen 20 for carrying other portions of the control circuit elements 18. The side printed circuit boards and the rear printed circuit board form an open boxlike configuration which receives the neck portion 39 of the tube 16 in a compact close-fitting arrangement. The width of the top and bottom circuit boards 51 and 55 is each less than the width of the screen 20, and the width of the left side panel circuit board 53 is less than the height of the screen 20. As a result, in accordance with the present invention, the side and rear panels can conveniently fit within the housing 14, and the housing 14 in turn has a height and width which are substantially the same as the height and width of the screen 20.

For the purpose of mechanically and electrically interconnecting the side printed circuit board to the rear end printed circuit board 46, an electrical connector 57 interconnects the marginal edges of the rear circuit board 46 and the bottom side circuit board 51 at right angles to one another, and similarly, connectors 57 and 59 interconnect the left side printed circuit board 53 and the top side printed circuit board 55 with the rear end printed circuit board 46 in such a manner that the left side printed circuit board 53 and the top side printed circuit board 55 extend at right angles from the rear board 46. Such connectors electrically interconnect the control circuit elements carried by the side and rear circuit boards.

Considering now the electrical connectors in greater detail, only the connector 62 will now be described, since the other electrical connectors are similar in construction. As shown in FIGS. 6 and 7 of the drawings, the connector 62 includes a female socket 64 for releasably receiving tab conductors 66 printed on the rear end circuit board 46 to electrically and mechanically interconnect in a releasable manner the rear end circuit board 46 and the top side circuit board 55. The female socket 64 includes a series of spring clips such as the spring clip 67 which is formed from a single conductive wire bent into the shape of a pair of parallel spaced-apart spring fingers for receiving one of the tap conductors 66 therebetween for mechanically and electrically interconnecting therewith. The female socket 64 also includes a pair of retainer guides, such as the guide 68 which fit into a pair of parallel-extending spacedapart slots 71 and 72 (FIG. 9) in the printed circuit board 46. The retainer guides facilitate the interconnection and limit transverse movement between the female socket and the tab conductors. It should be noted that the arrangement of the connector 62 is such that the two printed circuit boards 55 and 46 are connected together at right angles to form a corner. In this regard, the female socket 64 can readily be plugged into the tab conductors 66 such that the spring clips register with corresponding ones of the tab conductors 66.

As best seen in FIG. 3, the bottom printed circuit board 51 includes a generally T-shaped rearwardly extending projection for extension 73 which connects with an outer rear panel in the form of a printed circuit board 75 by means of a connector 77, which is similar in construction to the connector 62. The outer rear printed circuit board 75 supports additional circuit elements or components (only some of which are shown) for facilitating the operation of the oscilloscope assembly 10. A large central hole 79 in the board 75 receives loosely a tube socket 82 removably attached to the distal end portion of the rear portion 39 of the tube 16. Leads, such as a lead 84, connect the socket 82 to the pin terminals 37 mounted on the back side of the board 75 via printed conductors (not shown) on the board 75. As best seen in FIG. 4 of the drawings, leads such as a lead 86 electrically interconnect the circuit components mounted on the board 75 to the deflection coils 41. Thus, the connector 77 electrically interconnects the circuitry mounted on the outer rear board 75 to the other circuit components and elements mounted on the other printed circuit boards of the assembly 10.

In order to mount the boxlike configuration of the side and end boards to the tube 51, four hexagonal rods, such as the rod 88 (FIG. 3) connect the rear circuit board 46 to the bezel 22, which in turn is fixedly connected to the tube 16 by any suitable technique, such as any suitable adhesive. A threaded forward end portion 88-A of the rod 88 is threaded into a tapped hole in the back side of the bezel 22. Similarly, four hexagonal rods, such as the rod 92 interconnect and space the boards 46 and 75, the rod 92 including a forwardly extending threaded end portion 92-A which is threaded into a tapped hole in the back end of the rod 88, the threaded end portion 92-A extending through an aligned hole in the board 46. Similarly, the housing 14 is secured to the boxlike configuration of printed circuit boards by four hexagonal rods, such as the rod 96. A forwardly extending threaded end portion 96-A of the rod 96 extends through an aligned hole in the board 75 and into a tapped hole in the rear end of the rod 92. A set of four screws 98 extend through four holes in the back wall 35 of the housing 14 and into an aligned tapped hole in the rods, such as the rod 96.

For the purpose of securely mounting the circuit components within the housing 14, and in the case where the housing 14 is composed of metal, for the purpose of electrically insulating the housing 14 from the circuits within the housing, each one of the side printed circuit boards has a pair of foam plastic strips 107 extending longitudinally across the outer face thereof. The strips 107 are secured by a suitable adhesive to the side printed circuit boards, and they extend longitudinally so that when the housing is slipped over the rear end portion of the tube 16 and the printed circuit boards, the housing 14 fits snugly in place.

It should be understood that the three side printed circuit boards are solely supported by the electrical connectors 56, 59 and 62 so that a repairman can very easily remove any one of them for repair or replacement purposes. Also, the outer rear printed circuit board 46 can be readily removed by simply removing the four posts, such as the post 46. The rear board 46 can also be replaced by removing the board 75 and the other posts, such as the post 92, however, the board 46, in the preferred form of the present invention, carries only printed wiring and no circuit components so that any failure would be highly unlikely. It should be understood that if additional circuits are required, a fourth side printed circuit board (not shown) could be attached by an electrical connector (not shown) to the rear board 46 on the right side of the assembly 10 in a manner similar to the left side printed circuit board 53.

According to the invention, it should be noted that all of the female sockets are mounted on the side printed ciruict boards and not on the rear end board 46 which only carries plated wiring conductors. Such an arrangement facilitates the compactness of the assembly 10, since if the female sockets were mounted on the rear board 46, it would have to be larger in size to carry the sockets, whereby the rear board 46 may then be larger in height and width than the respective height and width of the screen 20.

While the present invention has been described in connection with particular embodiment thereof, it will be understood that many changes and modifications of this invention may be made by those skilled in the art without departing from the true spirit and scope thereof. Accordingly, the appended claims are intended to cover all such changes and modifications as fall within the true spirit and scope of the present invention.

What is claimed is:
1. An oscilloscope assembly connected to input means conveying electrical input signals and electrical power thereto, comprising:
- a cathode ray oscilloscope tube having a screen and having a rearwardly extending longitudinal neck portion connected electrically to said input means for supplying power thereto, said tube being adapted to establish an electron beam for illuminating the face of said screen;
- deflecting means mounted on said neck portion and connected electrically to said input means for diverting selectively the path of travel of said beam;
- a plurality of control circuit elements connected electrically to said deflection means and connected electrically to said input means for energizing selectively said deflection means to selectively illuminate said screen in response to said input signals;
- a rear end circuit panel fixedly connected to said tube and extending transversely to said neck portion, said rear end panel supporting a portion of said control circuit elements, the height and width of the face of said rear panel being less than the corresponding height and width of said screen;
- a plurality of side circuit panels extending forwardly from said rear panel toward said screen parallel to the axis of said neck portion and forming an open boxlike configuration with said rear end panel, said boxlike configuration at least partially receiving said neck portion, said side panels each supporting other portions of said control circuit elements;

female and male connecting means interconnecting mechanically the adjoining marginal edges of said side panels to said rear panel and interconnecting electrically the circuit elements supported by said rear end and side panels, said female connecting means being each mounted to said side panels, said male connecting means being mounted on said rear end panel; and a housing having an open front end portion receiving said screen and confining at least partially said tube, said deflection means, said circuit elements, said panels and said connecting means.

2. An oscilloscope assembly according to claim 1, wherein said end and side panels each comprise printed circuit boards, wherein said connecting means includes a plurality of female spring clip sockets, and groups of plated conductors received in said sockets, the width of said side circuit panels each being less than the corresponding dimension of said screen.

3. An oscilloscope assembly according to claim 2, wherein each one of the sockets is mounted on said side circuit panels and each one of said groups of conductors is a part of said rear end panel.

4. An oscilloscope assembly according to claim 2, wherein said rear end panel includes means defining a hole receiving the distal end portion of said neck portion.

5. An oscilloscope assembly connected to input means conveying electrical input signals and electrical power thereto, comprising:

a cathode ray oscilloscope tube having a screen and having a rearwardly extending longitudinal neck portion connected electrically to said input means for supplying power thereto, said tube being adapted to establish an electron beam for illuminating the face of said screen;

deflection means mounted on said neck portion and connected electrically to said input means for diverting selectively the path of travel of said beam;

a plurality of control circuit elements connected electrically to said deflection means and connected electrically to said input means for energizing selectively said deflection means to selectively illuminate said screen in response to said input signals;

a rear end circuit panel fixedly connected to said tube and extending transversely to said neck portion, said rear end panel supporting a portion of said control circuit elements, the height and width of the face of said rear panel being less than the corresponding height and width of said screen;

a plurality of side circuit panels extending forwardly from said rear panel toward said screen parallel to the axis of said neck portion and forming an open boxlike configuration with said rear end panel, said boxlike configuration at least partially receiving said neck portion, said side panels each supporting other portions of said control circuit elements;

connecting means interconnecting mechanically the adjoining marginal edges of said side panels to said rear panel and interconnecting electrically the circuit elements supported by said rear end and side panels;

a housing having an open front end portion receiving said screen and confining at least partially said tube, said deflection means, said circuit elements, said panels and connecting means;

wherein said end and side panels each comprise printed circuit boards, wherein said connecting means includes a plurality of female spring clip sockets, and groups of plated conductors received in said sockets, the width of said side circuit panels each being less than the corresponding dimension of said screen;

wherein each one of the sockets is mounted on said side circuit panels and each one of said groups of conductors is a part of said rear end panel;

wherein said rear end panel includes means defining a hole receiving the distal end portion of said neck portion; and wherein one of said side panels includes a rearwardly extending tab portion, further including an outer rear panel extending parallel to the first-mentioned rear panel and connected to said tab portion by said connecting means.

6. An oscilloscope assembly according to claim 5, wherein said outer rear panel includes means defining a hole, further including a socket mounted on the distal end portion of said rear portion of said tube, said socket being at least partially disposed within the last-mentioned hole.

7. An oscilloscope assembly according to claim 6, further including a bezel surrounding the face of said screen of said tube and attached thereto, a plurality of longitudinally-extending posts mounting the first-mentioned inner panel to said bezel.

8. An oscilloscope assembly according to claim 7, said housing having an open front end portion over which extends said bezel and said screen, a second plurality of longitudinally extending posts mount the rear wall of said housing to said rear panel.

9. An oscilloscope assembly according to claim 8, wherein said side panels comprise three printed circuit boards extending at right angles to the first-mentioned rear.

10. An oscilloscope assembly connected to input means conveying electrical input signals and electrical power thereto, comprising:

a cathode ray oscilloscope tube having a screen and having a rearwardly extending longitudinal neck portion connected electrically to said input means for supplying power thereto, said tube being adapted to establish an electron beam for illuminating the face of said screen;

deflection means mounted on said neck portion and connected electrically to said input means for diverting selectively the path of travel of said beam;

a plurality of control circuit elements connected electrically to said deflection means and connected electrically to said input means for energizing selectively said deflection means to selectively illuminate said screen in response to said input signals.

a rear end printed circuit panel fixedly connected to said tube and extending transversely to said neck portion, said rear end panel supporting a portion of said control circuit elements;

a plurality of side printed circuit panels extending forwardly from said rear panel toward said screen parallel to the axis of said neck portion and forming an open boxlike configuration with said rear end panel, said boxlike configuration at least partially receiving said neck portion, said side panels each supporting other portions of said control circuit elements;

female and male connecting means interconnecting mechanically the adjoining marginal edges of said side panels to said rear panel and interconnecting electrically the circuit elements supported by said rear end and side panels, said female connecting means being each mounted to said side panels, said male connecting means being printed tab conductors mounted on said rear end panel; and a housing having an open front end portion receiving said screen and confining at least partially said tube, said deflection means, said circuit elements, said panels and said connecting means.

11. An oscilloscope assembly according to claim 10, with the height and width of the face of said rear panel being less than the corresponding height and width of said screen.

* * * * *